United States Patent [19]

Soclof

[11] 4,435,899
[45] Mar. 13, 1984

[54] METHOD OF PRODUCING LATERAL TRANSISTOR SEPARATED FROM SUBSTRATE BY INTERSECTING SLOTS FILLED WITH SUBSTRATE OXIDE

[75] Inventor: Sidney I. Soclof, San Gabriel, Calif.

[73] Assignee: Rockwell International Corporation, El Segundo, Calif.

[21] Appl. No.: 450,310

[22] Filed: Dec. 16, 1982

Related U.S. Application Data

[62] Division of Ser. No. 239,750, Mar. 2, 1981.

[51] Int. Cl.³ .................. H01L 21/265; H01L 21/302
[52] U.S. Cl. .............................. 29/577 R; 29/576 W; 29/578; 29/580; 148/187
[58] Field of Search .................... 29/578, 580, 576 W, 29/576 B, 577 R; 148/187; 156/643; 427/93

[56] References Cited

U.S. PATENT DOCUMENTS

| | | | |
|---|---|---|---|
| 3,623,923 | 11/1971 | Kennedy et al. | 148/187 X |
| 3,914,857 | 10/1975 | Goser et al. | 29/579 |
| 4,050,965 | 9/1977 | Ipri et al. | 148/187 X |
| 4,086,694 | 5/1978 | U | 29/580 X |
| 4,104,090 | 8/1978 | Pogge | 148/187 X |
| 4,232,439 | 11/1980 | Shibata | 29/579 |
| 4,280,854 | 7/1981 | Shibata et al. | 29/579 X |
| 4,335,503 | 6/1982 | Evans, Jr. et al. | 29/576 B |

OTHER PUBLICATIONS

Evans et al., "A-1-MM Bipolar VLSI Technology", IEEE Transactions on Electron Devices, vol. ED-27, No. 8, Aug. 1980, pp. 1373-1379.

*Primary Examiner*—G. Ozaki
*Attorney, Agent, or Firm*—H. Fredrick Hamann; Wilfred G. Caldwell

[57] ABSTRACT

The invention is a transistor or array thereof and method for producing same in sub-micron dimensions on a silicon substrate doped P or N type by forming slots in spaced apart relation across the substrate to define semi-arrays of V shaped intermediate regions which will become a plurality of transistors. Silicon oxide fills these slots and separates the transistor regions from the substrate. Orthogonal slots divide the semi-arrays into individual transistor active regions which are doped by one of N or P doping introduced into each active regions via the orthogonal slots and driven in to comprise the emitter and collector regions on respective sides of original substrate comprising the base regions. Metallization patterns complete electrical connections to the emitter base and collector regions and silicon oxide substantially covers the periphery of each active region for total isolation. Each transistor may further comprise a doped region called P or N doping extending into and across the top of the base region to reduce space region contact resistance and to provide an electron reflecting potential barrier. Each transistor may further comprise a doped skin of either P or N doping to force electrons or holes toward the center of the base region.

11 Claims, 12 Drawing Figures

METHOD OF PRODUCING LATERAL TRANSISTOR SEPARATED FROM SUBSTRATE BY INTERSECTING SLOTS FILLED WITH SUBSTRATE OXIDE

This application is a division of application Ser. No. 239,750, filed Mar. 2, 1981.

FIELD OF THE INVENTION

This invention is a novel structure and method for forming a sub-micron type lateral dielectrically isolated transistor utilizing VLSI chip processing steps to fabricate hundreds of such devices, simultaneously.

BACKGROUND OF THE INVENTION

Techniques extracted from the prior art come from the field of sub-micron fabrication technology wherein the dimensional resolution is now comparable to or even smaller than the thicknesses of the thermally grown silicon oxide layers on silicon. Also, the dimensions are now comparable to or even smaller than the base widths used for double diffused transistors, i.e. 0.4 to 1.0 micrometers. From these techniques, the novel structure and method for the lateral transistors with greatly reduced parasitic capacitance and resistances are achieved.

SUMMARY OF THE INVENTION

The invention is a novel lateral NPN or PNP type transistor formed on a substrate by intersecting slots and orthogonal slots for defining each active region undercut by the intersecting slots and filled with substrate oxide to isolate the active regions from the substrate. Prior to oxidation filling the orthogonal slots, doping is introduced from the opposed surfaces of each individual active region to complete the NPN formation in a P doped substrate or the PNP formation in an N doped substrate. Electrical connections are made in conventional fashion to the emitter, base and collector regions.

A further feature provides a doped region extending into and across the top of the base region underneath the metallization to reduce the base region contact resistance and provide an electron or hole deflecting potential barrier. Further, each transistor may be lightly doped about its periphery such that the doped skin forces electrons or holes towards the center of the base region.

BRIEF DESCRIPTION OF A PREFERRED EMBODIMENT OF THE INVENTION

In the device produced in accordance with the present invention, the effects of the substrate are minimized relative to the operation of the device. It should be realized that the isolated active region may be completely contained within a surface area of approximately $6d \times 3d = 18d^2$ wherein d is only 0.4 micrometers. The active region is completely separated from the substrate by substrate oxidation and the parasitic capacitances and resistances are almost completely reduced to a minimum value attainable because the transistor is reduced to just its electronically active region. In the conventional (vertical) transistor, the electrically active region is only a very small fraction of the total transistor area or volume.

The dielectric isolation between transistors offered by the substrate oxidation has advantages with respect to high frequency performance, high voltage integrated circuits, radiation resistance, and circuit flexibility, i.e. the process can provide NPN, PNP, JFET, MOSFET, etc. devices on the same integrated circuit chip.

The principles of the invention apply equally to NPN or PNP type transistors wherein the base may be graded P+P or N+N and it may incorporate a base region potential barrier that will deflect the electrons or holes in transit across the base region away from the base metallization contact. This also reduces the base region contact resistance. Also, a doped skin may be formed around the active portion of the device to keep the electrons or holes away from the base periphery and urged toward the central part of the base region. This aids in reducing surface recombination and thus increases gain, especially for operation at very low current levels.

Figure 1:
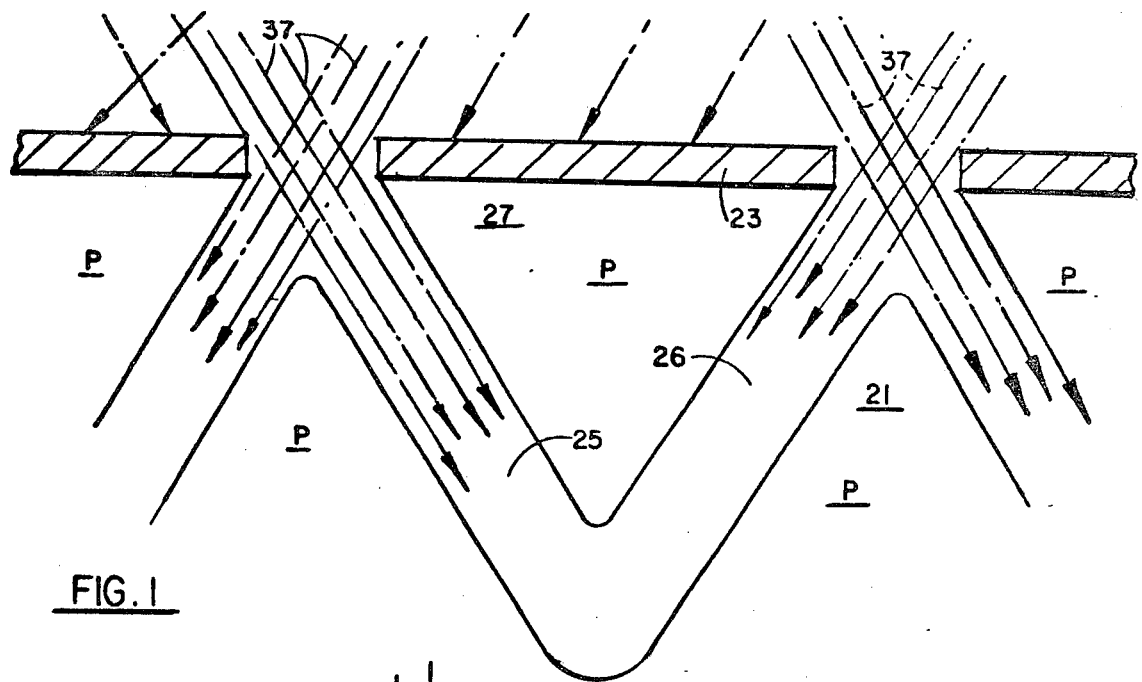
FIG. 1 is a cross sectional view through the substrate showing the formation of intersecting slots.

Referring now to FIG. 1, substrate 21 is masked by photoresist 23 which is patterned to define the penetration regions for intersecting slots 25 and 26. Since substrate 21 is shown doped P type, the intermediate region 27 which will eventually comprise a plurality of transistors, is also of P type, having been carved from the substrate by the slots 25 and 26. To prevent intermediate region 27, better defined as array of transistor regions, from falling into substrate 21, it should be noted that the slots 25 and 26 are interrupted to leave shoulders at spaced apart intervals therealong, best seen at 31, 32 and 33 in FIG. 4.

Since the preferred way of forming slots 25 and 26 is by ion milling, shown by the flux lines 37 in FIG. 1, the masking layer 23 is a material with a low sputtering rate such as one of the heavier metals.

Figure 2:
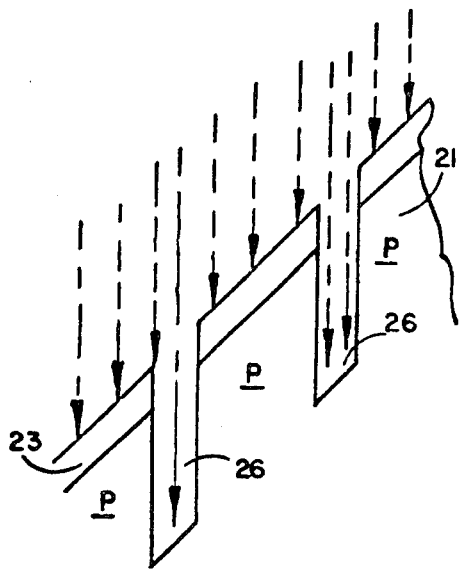
FIG. 2 shows a substrate oriented at an angle above the horizontal such that vertical milling may form the diagonally penetrating slots.
Figure 3:
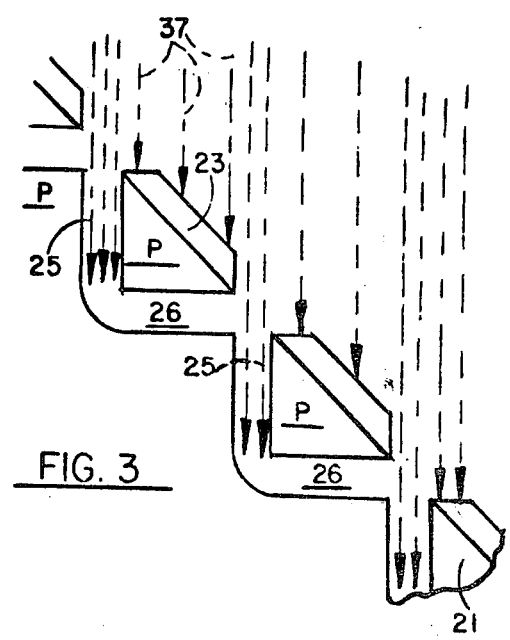
FIG. 3 shows the substrate oppositely oriented to that of FIG. 2 such that vertical milling may again form the other portion of the intersecting slots.

FIGS. 2 and 3 illustrate the ease of forming intercepting slots such as 25 and 26 simply by orienting the substrate at angles, e.g. 60° to the horizontal, such that the ion flux 37 may remain in its vertical pattern to form first slots 26 and thereafter slots 25 simply by rotating the substrate 21 by 90°.

While the triangular array 27 is shown as being substantially equilateral, it need not be and the angles may be varied to configure the active regions as desired for specific purposes. It will also be noticed from FIGS. 2 and 3 that slots 25 and 26 terminate where they intercept because extending them deeper into the substrate would serve no purpose.

Figure 4:
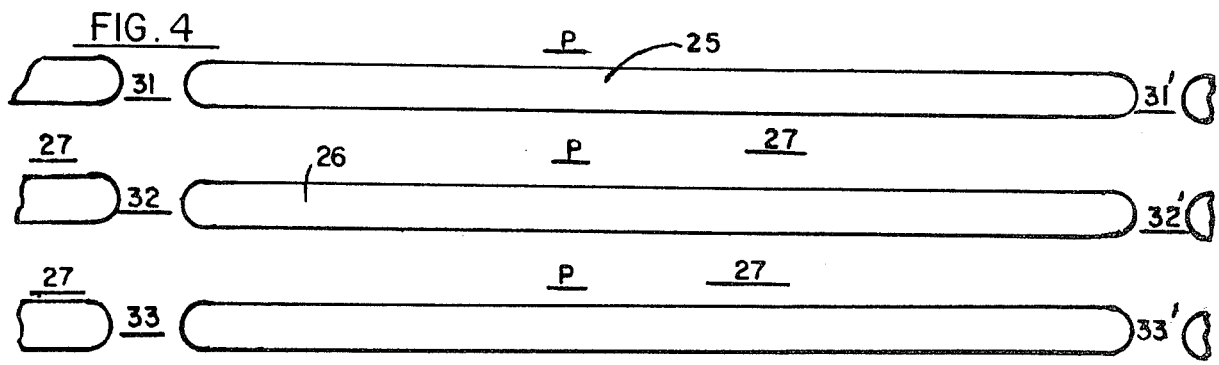
FIG. 4 is a view in top plan of the substrate showing the spaced apart intersecting slots with support regions between the ends thereof.

From FIG. 4 it may be seen that the slots 25 and 26 may be intermittent such that supporting ribs or webs 31, 32, 33 and 31', 32', 33' serve to support each array 27. These webs or supports may be at spaced apart locations along the slots 25 and 26 or merely comprise only supports at the edges of the chips because they serve but a temporary purpose as the slots will be filled with substrate oxide to provide the permanent support for each transistor region.

Figure 5:
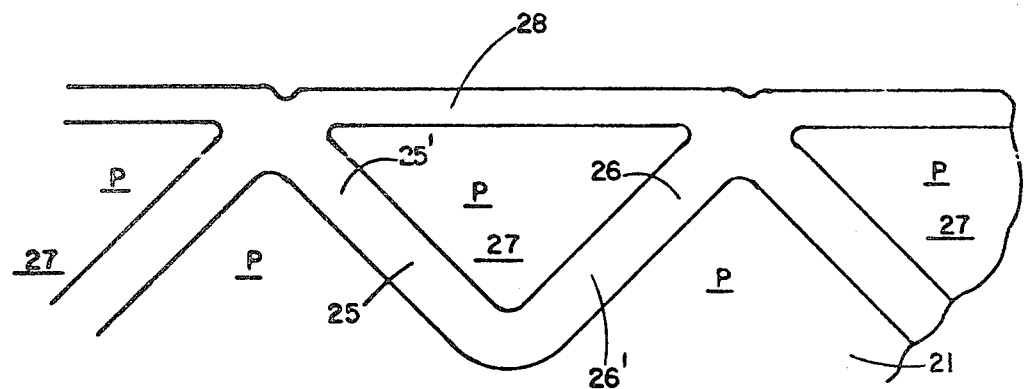
FIG. 5 is a front view of the triangular arrays of substrate formed by the intersecting slots and separated from the substrate proper.

The oxidation step is shown in FIG. 5 wherein silicon oxide 25' and 26' fill the respective slots 25 and 26. Also, an upper layer of silicon oxide 28 covers the upper surface and is contiguous with the silicon oxide 25' and 26' such that array 27 is totally isolated from the substrate 21 by the silicon oxide and the peripheries of the arrays 27 are substantially covered by the oxide.

Figure 6:
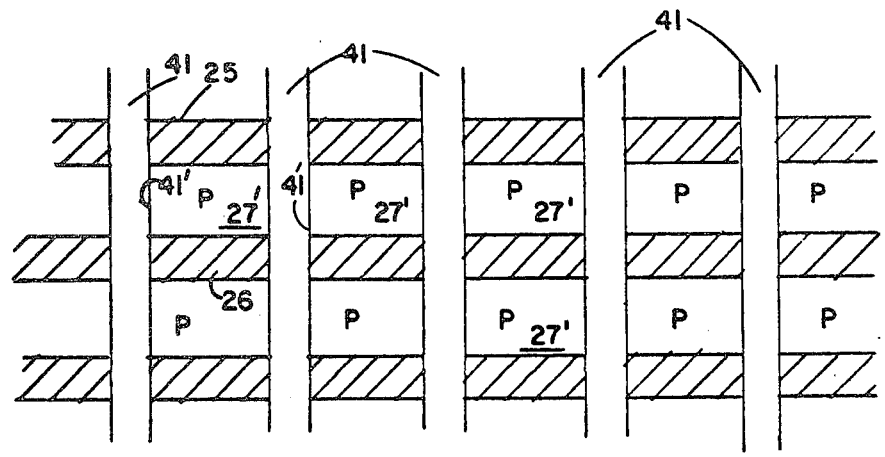
FIG. 6 shows the introduction of orthogonal slots relative to the pairs of intersecting slots.
Figure 7:
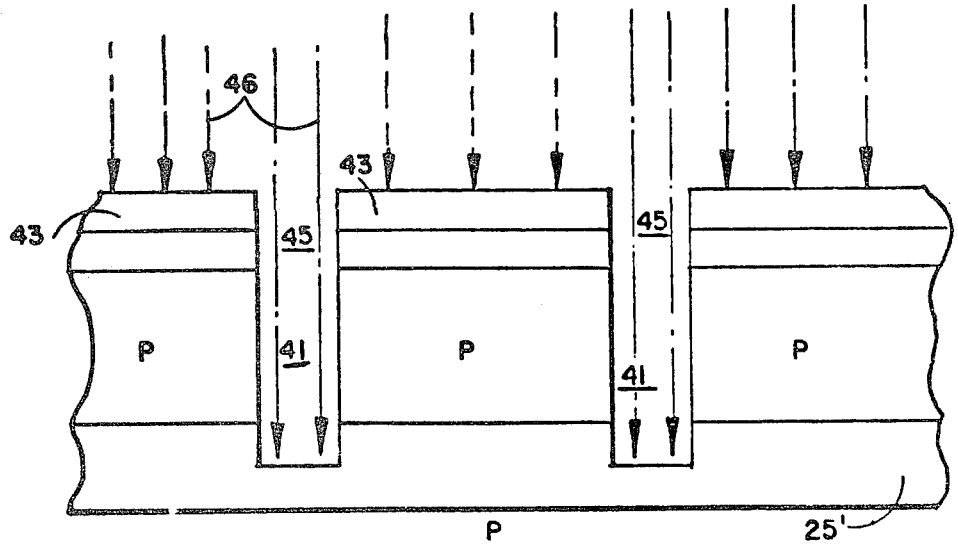
FIG. 7 shows the formation of the orthogonal slots via milling.

In FIG. 6 orthogonal slots 41 divide the semi-arrays 27 into the individual transistor regions 27' and provide ingress for the doping to follow. Thus, each orthogonal slot 41 includes sidewalls 41' through which individual transistor regions 27' will be doped. The other sidewalls of slots 41 provide for doping adjacent transistor regions 27'. Slots 41 may be ion milled using the masking technique heretofore employed. Consequently photoresist 43 of a heavier metal is patterned as shown in FIG. 7 to provide for ion milling slots 41 via the openings 45 in the heavy photoresist 43 and silicon oxide. The ion flux is illustrated by the lines 46.

Figure 8:
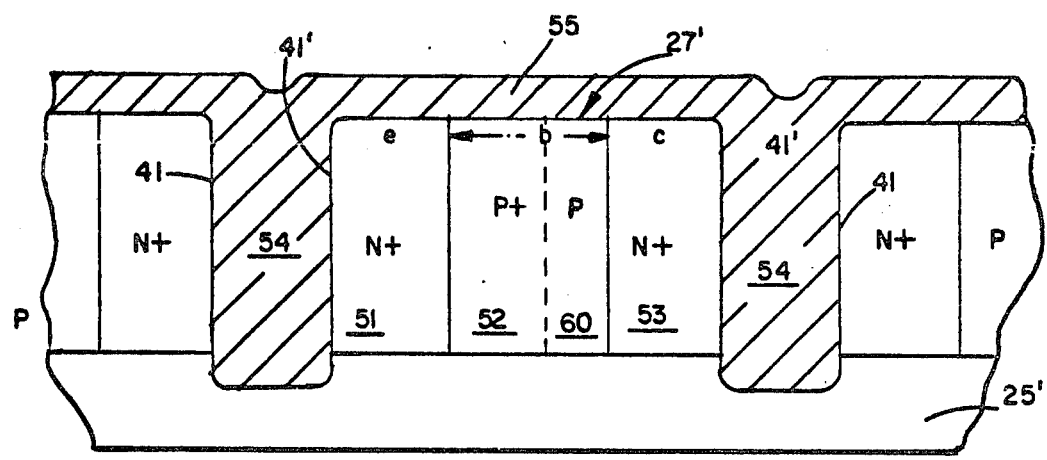
FIG. 8 is a view of a single active transistor region following N+ doping via the orthogonal slots and thereafter oxidation filling the same.

In FIG. 8, an individual transistor region 27' is shown comprising the N+ doped region 51, P doped region 52 and N+ doped region 53. The P region 52 is the base region and comprises a portion of the original substrate 21. However, both N+ regions 51 and 53 are provided by doping region 27' via the sidewalls 41' of orthogonal slots 41 (FIG. 6) with phosphorus deposition, diffusion or implantation plus drive-in to create the emitter region 51 and the collector region 53. Thereafter, the structure of FIG. 8 is oxidized to fill in slots 41 with silicon oxide 54 and covering layer 55.

A slight variation of the structure of FIG. 8 is indicated by the dotted line 60 wherein the P region 52 may comprise a P+ region 52 and a P region 60 simply by providing a boron doping via the left hand sidewall 41' prior to the phosphorus doping and then driving in the P+ region 52 such that the base will now comprise a graded P+P region 52, 60.

Figure 9:
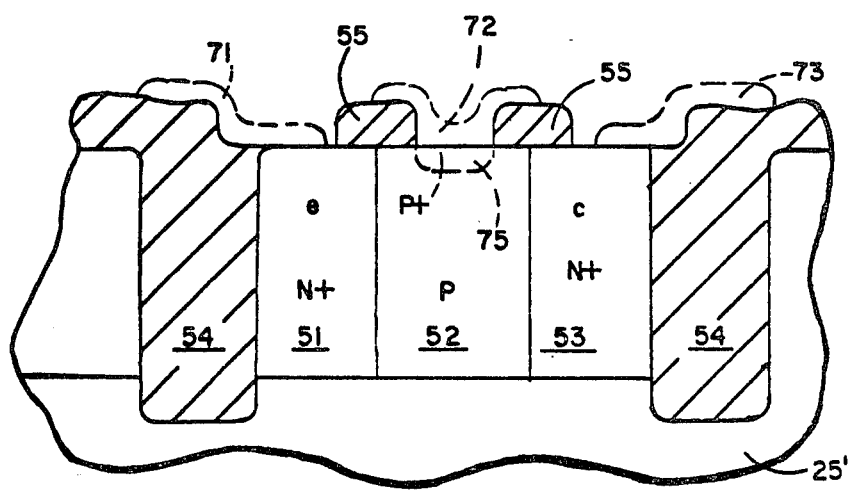
FIG. 9 is a view of the structure of FIG. 8 with metallization contacts for the emitter, base and collector regions.

The next step in the process is illustrated in FIG. 9 wherein the silicon oxide layer 55 has been patterned and metallization applied to comprise the emitter electrode 71, base electrode 72 and collector electrode 73. However, prior to applying the metallization, a light boron deposit has been made in the base region 52 to provide the P+ base spanning region 75.

The purpose of the boron deposition 75 prior to the metallization is twofold i.e. first to reduce the base region contact resistance and second to produce a potential barrier P+/P that will deflect the electrons or holes in transit across the base region 52 away from the base contact.

Figure 10:
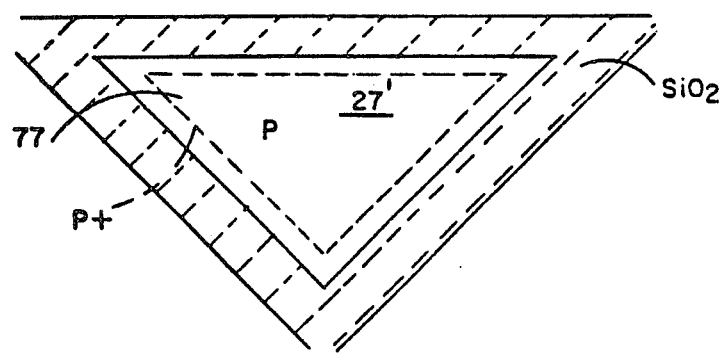
FIG. 10 shows a P+ skin applied to the periphery of a P-doped transistor.

In FIG. 10 another innovation is shown in the form of the P+ skin 77 about the periphery of the individual transistor active region 27'. The P+ skin is formed by a light boron deposition for the purpose of keeping the electrons or holes away from the base periphery and urging them toward the central part of the base region 52. This reduces surface recombination and thus, increases gain, especially for operation at currents in the nanoampere range.

Figure 11:
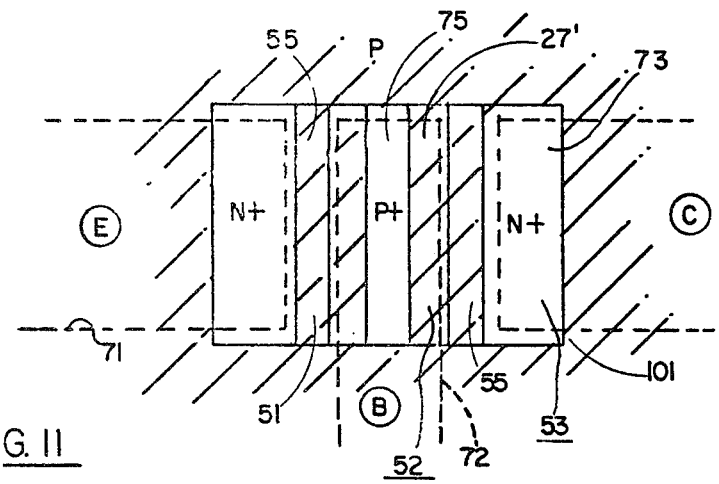
FIG. 11 is a top plan view showing the electrode connections.

FIG. 11 shows a completed transistor in accordance with the general principles of the invention wherein the active region 27' is shown totally surrounded by the silicon oxide 101 and the electrodes 71, 72 and 73 for the emitter region 51, base region 52 and collector 53 are seen in top plan view. Also, the P+ base spanning region 75 is seen in plan view across base region 52.

As previously mentioned, the transistor is reduced to just its electronically active area.

By using an angled boron implantation prior to the phosphorus deposition of FIG. 8, the drift field P+,P in the base region 52 was produced such as is found in conventional double diffused devices.

Figure 12:
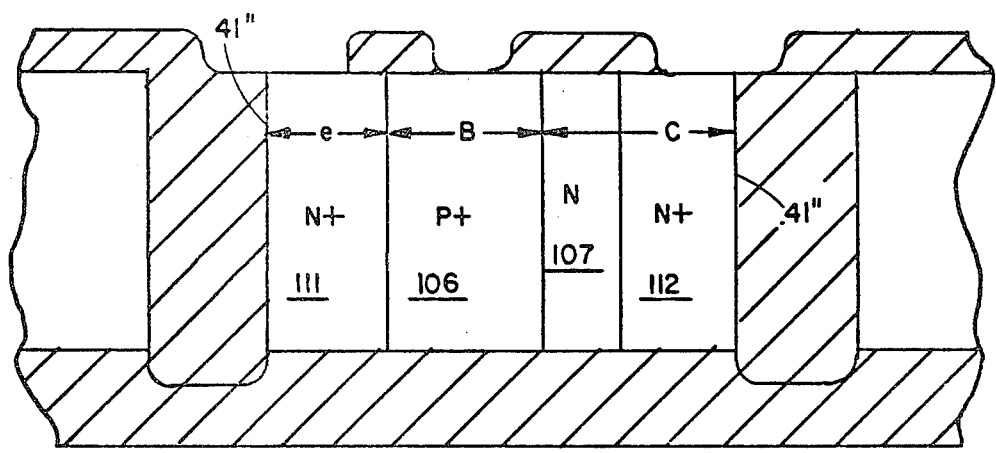
FIG. 12 shows a transistor produced starting with an N doped substrate and ending with a NPN transistor or if a boron doping step is included, an N+ P+N N+ transistor.

Finally, an NPN device can be built utilizing an N-type substrate in the manner of having built the PNP device starting from a P substrate as described. This is shown in FIG. 12 wherein all doping is accomplished through the sidewalls 41" of the orthogonal slots, as previously explained. First the P+ region 106 is formed via angled implanting through the left hand sidewall 41" of boron material, followed by heating to drive in region 106 to its position shown in FIG. 12 adjacent an original portion 107 of the N substrate.

Next, phosphorus doping is carried out through both sidewalls 41" to form the emitter region 111 doped N+ and the remaining portion of the collector region doped N+, and shown at 112, which taken together within region 107, comprises the collector.

Patterning of the silicon oxide on the top of this device has been shown and it is only necessary to lay down the metallization pattern for electrical connection to the various transistor regions.

Thus, a lateral, dielectrically isolated NPN transistor with a drift field in the base and an NN+ collector region has been formed with all the characteristics heretofore attributed to these submicron devices.

While further modifications may occur to those skilled in the art from a reading of the detailed description hereof, it is intended that the invention be defined by the scope of the claims appended wherein:

What is claimed is:

1. A method for producing an array of sub-micron dimensioned NPN type lateral transistors formed in a silicon substrate doped P-type, comprising the steps of:
    forming a plurality of first sidewalls of pairs of intersecting slots in spaced apart relation across the substrate defining semi-arrays of V shaped intermediate regions which will become transistors;
    oxidizing the substrate and intermediate regions to fill said slots and cover the surface of the substrate through which they were made;
    forming a plurality of second sidewalls of orthogonal slots relative to said pairs of slots dividing the semi-arrays of regions into individual transistor active regions;
    N+ doping each of said active regions through the inner opposed second sidewalls;

driving in said doping to comprise emitter and collector regions on respective sides of original P substrate comprising the base regions;

further oxidizing said substrate to fill in said orthogonal slots and insure total peripheral oxide isolation of each transistor active region; and forming metallization patterns in electrical connection with the respective emitter, base and collector regions.

2. A method in accordance with claim 1, comprising:

further P+ doping a region extending into and across the top of the base region to reduce base region contact resistance and to provide a hole deflecting potential barrier.

3. A method in accordance with claims 10 or 2, comprising:

further providing a P+ doped skin to force holes toward the center of the base region.

4. A method for producing an array of sub-micron dimensioned PNP type lateral transistors formed in a silicon substrate doped N-type, comprising the steps of:

forming a plurality of first sidewalls of pairs of intersecting slots in spaced apart relation across the substrate defining semi-arrays of V shaped intermediate regions which will become transistors;

oxidizing the substrate and intermediate regions to fill said slots and cover the surface of the substrate through which they were made;

forming a plurality of second sidewalls of orthogonal slots relative to said pairs of slots dividing the semi-arrays of regions into individual transistor active regions;

P+ doping each of said active regions through the inner opposed second sidewalls;

driving in said doping to comprise emitter and collector regions on respective sides of original N substrate comprising the base regions;

further oxidizing said substrate to fill in said orthogonal slots and insure total peripheral oxide insulation of each transistor active region; and forming metallization patterns in electrical connection with the respective emitter, base and collector regions.

5. A method in accordance with claim 4, comprising:

further N+ doping a region extending into and across the top of the base region to reduce base region contact resistance and to provide a hole deflecting potential barrier.

6. A method in accordance with claims 13 or 5, comprising:

further providing a N+ doped skin to force holes toward the center of the base region.

7. A method for producing an array of sub-micron dimensioned lateral transistors formed in a silicon substrate doped P type for forming an NPN type transistor and doped N type for forming a PNP type transistor, comprising the steps of:

forming a plurality of first sidewalls of pairs of intersecting slots in spaced apart relation across the substrate defining semi-arrays of V shaped intermediate regions which will become transistors;

oxidizing the substrate to fill said slots and cover the surface of the substrate through which they were made;

forming a plurality of second sidewalls of orthogonal slots relative to said pairs of slots dividing the semi-arrays of regions into individual transistor active regions;

doping each of said active regions through the inner opposed second sidewalls using N doping for P doped substrate and P doping for N doped substrate;

driving in said doping to comprise emitter and collector regions on respective sides of the original substrate comprising the base regions;

further oxidizing said substrate to fill in said orthogonal slots and insure total peripheral oxide isolation of each transistor active region; and, forming metallization patterns in electrical connection with the respective emitter, base and collector regions.

8. A method in accordance with claim 7, comprising:

further doping a region extending into and across the top of the base region by using N doping for an N substrate and P doping for a P substrate to reduce base region contact resistance and to provide a deflecting potential barrier.

9. A method in accordance with claim 7 or 17, comprising:

further doping the skin to force carriers toward the center of the base region by using P+ doping for P substrate and N+ doping for N substrate.

10. The method of claim 7, wherein:

said substrate is P doped; and, said doping by way of the second sidewalls is N+ to provide an N+PN+ transistor.

11. The method of claim 7, wherein:

said substrate is N doped; and said doping by way of the second sidewalls is P+, followed by N+ to provide an N+P+NN+ transistor.

* * * * *

UNITED STATES PATENT AND TRADEMARK OFFICE
CERTIFICATE OF CORRECTION

PATENT NO. : 4,435,899
DATED : March 13, 1984
INVENTOR(S) : Sidney I. Soclof

It is certified that error appears in the above-identified patent and that said Letters Patent are hereby corrected as shown below:

Claim 3, first line, please delete [10] and substitute therefor --1--.

Claim 6, first line, please delete [13] and substitute therefor --4--.

Claim 9, first line, please delete [17] and substitute therefor --8--.

Signed and Sealed this

Twelfth Day of June 1984

[SEAL]

Attest:

GERALD J. MOSSINGHOFF

*Attesting Officer*    *Commissioner of Patents and Trademarks*